(12) United States Patent
Nakayama

(10) Patent No.: US 12,107,354 B2
(45) Date of Patent: Oct. 1, 2024

(54) COAXIAL FLAT CABLE

(71) Applicant: TOTOKU ELECTRIC CO., LTD., Tokyo (JP)

(72) Inventor: Nobuaki Nakayama, Ueda (JP)

(73) Assignee: TOTOKU ELECTRIC CO., LTD., Tokyo (JP)

( * ) Notice: Subject to any disclaimer, the term of this patent is extended or adjusted under 35 U.S.C. 154(b) by 27 days.

(21) Appl. No.: 17/920,241

(22) PCT Filed: Dec. 14, 2020

(86) PCT No.: PCT/JP2020/046606
§ 371 (c)(1),
(2) Date: Oct. 20, 2022

(87) PCT Pub. No.: WO2021/215044
PCT Pub. Date: Oct. 28, 2021

(65) Prior Publication Data
US 2023/0163493 A1     May 25, 2023

(30) Foreign Application Priority Data
Apr. 21, 2020   (JP) ................................ 2020-075520

(51) Int. Cl.
*H01R 12/53*      (2011.01)
*H01B 7/08*       (2006.01)

(52) U.S. Cl.
CPC ........... *H01R 12/53* (2013.01); *H01B 7/0838* (2013.01); *H01B 7/0861* (2013.01)

(58) Field of Classification Search
CPC .. H01B 11/203; H01B 7/0838; H01B 7/0846; H01B 7/0861; H01R 12/53;
(Continued)

(56) References Cited

U.S. PATENT DOCUMENTS 2,992,407 A  *  7/1961  Slusher .............. H01B 11/1865
                                                    333/244
4,700,159 A  *  10/1987  Jones, III ............... H01R 24/44
                                                    333/260
(Continued)

FOREIGN PATENT DOCUMENTS

JP        3-236112 A       10/1991
JP     2001-291979 A       10/2001
(Continued)

OTHER PUBLICATIONS

International Search Report for PCT/JP2020/046606 dated, Jan. 19, 2021 (PCT/ISA/210).

*Primary Examiner* — William H. Mayo, III
*Assistant Examiner* — Rhadames Alonzo Miller
(74) *Attorney, Agent, or Firm* — Sughrue Mion, PLLC

(57) ABSTRACT

To provide a coaxial flat cable that can achieve stable high-frequency transmission characteristics as a structure by which stress is not applied to a specific coaxial cable, even due to handling of the coaxial flat cable or the like. The above-described problem is solved by a coaxial flat cable (20) comprising a plurality of coaxial cables (10) disposed side by side in a width direction (X), and a resin tape (11) integrating at least terminal parts (21) of these coaxial cables (10) from one surface or both surfaces, each of the plurality of coaxial cables (10) being connected by soldering to a substrate (30) or a connector. The resin tape (11) positioned at the terminal parts (21) is configured to be provided with a fixed part (21a), to be fixed to the substrate or the connector, at both end portions in the width direction (X).

8 Claims, 10 Drawing Sheets

(58) Field of Classification Search
CPC .............................. H01R 12/598; H01R 12/62; H01R 13/65918; H01R 4/023; H01R 9/0515; H05K 1/18
See application file for complete search history.

(56) References Cited

U.S. PATENT DOCUMENTS

| | | | | |
|---|---|---|---|---|
| 4,800,351 | A * | 1/1989 | Rampalli | H01Q 13/203 333/237 |
| 4,894,488 | A * | 1/1990 | Gupta | H01B 13/142 156/51 |
| 5,147,510 | A * | 9/1992 | Iura | H01R 12/592 439/930 |
| 5,262,593 | A * | 11/1993 | Madry | H01B 11/1856 174/29 |
| 5,422,614 | A * | 6/1995 | Rampalli | H01Q 13/203 333/237 |
| 5,742,002 | A * | 4/1998 | Arredondo | H01B 11/1847 174/126.3 |
| 6,346,671 | B1 * | 2/2002 | Ahrens | H01B 11/1834 174/102 R |
| 6,751,081 | B1 * | 6/2004 | Kooiman | H01T 4/08 361/120 |
| 7,525,041 | B2 * | 4/2009 | Howard | F02C 7/00 174/28 |
| 7,642,451 | B2 * | 1/2010 | Bonn | A61B 18/1815 174/102 R |
| 9,748,022 | B2 * | 8/2017 | Gareis | H01B 11/1804 |
| 9,773,585 | B1 * | 9/2017 | Rogers | H01B 7/295 |
| 9,799,429 | B2 * | 10/2017 | Adams | H01B 13/0009 |
| 9,922,751 | B2 * | 3/2018 | Zhang | H01B 11/1856 |
| 2002/0117325 | A1 * | 8/2002 | Mennone | H01B 7/295 174/121 A |
| 2003/0122636 | A1 * | 7/2003 | DiBenedetto | H01Q 13/203 333/237 |
| 2004/0118591 | A1 * | 6/2004 | Bufanda | H01B 11/1808 174/106 R |
| 2005/0183878 | A1 * | 8/2005 | Herbort | H01B 7/295 174/116 |
| 2008/0185168 | A1 * | 8/2008 | Matsukawa | H04M 1/0235 174/117 F |
| 2013/0093638 | A1 * | 4/2013 | Shoemaker | H01Q 1/007 343/770 |
| 2013/0098674 | A1 * | 4/2013 | Shoemaker | H02G 3/0481 174/480 |
| 2013/0106615 | A1 * | 5/2013 | Prammer | H01Q 1/04 340/854.6 |
| 2014/0008098 | A1 * | 1/2014 | Scaglione | H01B 7/295 174/107 |
| 2016/0236019 | A1 * | 8/2016 | Fyfe | B32B 27/065 |
| 2016/0248176 | A1 * | 8/2016 | Burris | H01R 24/48 |
| 2018/0083334 | A1 * | 3/2018 | Petrovic | H01P 3/08 |
| 2018/0174710 | A1 * | 6/2018 | Rogers | H01B 11/1834 |
| 2018/0286536 | A1 * | 10/2018 | Hazenfield | H01B 7/295 |
| 2020/0075196 | A1 * | 3/2020 | Eitel | H01B 3/46 |
| 2020/0211739 | A1 * | 7/2020 | Elsaadani | H01B 3/08 |

FOREIGN PATENT DOCUMENTS

| | | |
|---|---|---|
| JP | 2002-374615 A | 12/2002 |
| JP | 2006-085989 A | 3/2006 |
| JP | 2015-002136 A | 1/2015 |
| JP | 2017-513203 A | 5/2017 |
| JP | 2019-067518 A | 4/2019 |
| JP | 2019-067519 A | 4/2019 |

* cited by examiner

COAXIAL FLAT CABLE

CROSS REFERENCE TO RELATED APPLICATIONS

This application is a National Stage of International Application No. PCT/JP2020/046606 filed Dec. 14, 2020, claiming priority based on Japanese Patent Application No. 2020-075520 filed Apr. 21, 2020.

FIELD OF THE INVENTION

The present invention relates to a coaxial flat cable, and more particularly to a coaxial flat cable used in or between electronic devices such as a liquid crystal television or a server, and configured so that stress is not applied to a specific coaxial cable, even due to handling or the like.

BACKGROUND ART

A flat cable has excellent processability and flexibility, and is widely used as an internal wiring material or an external wiring material in an electronic device. As a flat cable particularly suitable for propagating high-frequency signals, coaxial flat cables that utilize a plurality of coaxial cables have been proposed. For example, Patent Document 1 proposes a coaxial flat cable that has a large center conductor diameter and a small finished outer diameter, and exhibits stable high-frequency characteristics. This coaxial flat cable is a coaxial flat cable including a plurality of coaxial cables disposed in parallel at regular intervals and a fixing tape that integrates at least terminal parts of the plurality of coaxial cables from one surface or both surfaces, the coaxial cables each including at least a center conductor, a dielectric layer provided on an outer periphery of the center conductor and including a void part continuous in a longitudinal direction, an external conductor provided on an outer periphery of the dielectric layer, and an insulating layer provided on an outer periphery of the external conductor.

PRIOR ART DOCUMENTS

Patent Documents

Patent Document 1: Japanese Laid-Open Patent Application Publication No. 2019-67518

SUMMARY OF THE INVENTION

Problems to be Solved by the Invention

The coaxial cables constituting the conventional coaxial flat cable described above are respectively soldered to a substrate at the external conductor and the center conductor. Nevertheless, in a case in which stress is applied to a specific coaxial cable due to handling after soldering or the like, the stress may concentrate on soldered parts of the external conductor and the center conductor, resulting in damage at the soldered parts. Damage at the soldered parts can cause deterioration in the high-frequency transmission characteristics of the coaxial flat cable.

The present invention was made to solve the problems described above, and an object thereof is to provide a coaxial flat cable configured so that stress is not applied to a specific coaxial cable, even due to handling of the coaxial flat cable or the like.

Means for Solving the Problems

A coaxial flat cable according to the present invention is a coaxial flat cable comprising a plurality of coaxial cables disposed side by side in a width direction, and a resin tape bonded to at least terminal parts of the plurality of coaxial cables from one surface or both surfaces to integrate the terminal parts, each of the plurality of coaxial cables being connected by soldering to a substrate or a connector. Of the resin tape, the resin tape positioned at the terminal parts is provided with a fixed part, to be fixed to the substrate or the connector, at both end portions in the width direction.

According to this invention, of the resin tape bonded to at least the terminal parts from one surface or both surfaces, the resin tape positioned at the terminal parts is provided with the fixed part, fixed (engaged, fitted, crimped, caulked, or the like) to the substrate or the connector, at both end portions in the width direction, making it possible to receive the applied stress across the entire resin tape and thus prevent stress from being applied to a specific coaxial cable. As a result, stress concentration on the soldered connection parts of a specific external conductor or center conductor is eliminated, making it possible to prevent damage at the soldered connection parts. It should be noted that the term "at least" means that the resin tape is always provided at the terminal parts, but the resin tape may be provided in a middle part other than the terminal parts as well.

In the coaxial flat cable according to the present invention, the fixed part is a hole or a projection fitted to a fitting part provided on the substrate or the connector.

According to this invention, the fixed part is a hole or a projection, and thus the hole or the projection is fitted into the fitting part provided on the substrate or the connector, fixing the coaxial flat cable to the substrate or the connector.

In the coaxial flat cable according to the present invention, the fixed part is a notch fitted to a fitting part provided on the substrate or the connector.

According to this invention, the fixed part is a notch, and thus the notch is fitted into the fitting part provided on the substrate or the connector, fixing the coaxial flat cable to the substrate or the connector.

In the coaxial flat cable according to the present invention, (1) in a case in which the resin tape is a cover tape that sandwiches and integrates the plurality of coaxial cables fully from both surfaces, a convex portion or a concave portion is provided to the cover tape. (2) In a case in which the resin tape is a reinforcing tape provided to the terminal parts of the plurality of coaxial cables, a convex portion or a concave portion is provided to the reinforcing tape. (3) In a case in which the resin tape is a cover tape that sandwiches and integrates the plurality of coaxial cables fully from both surfaces, and a reinforcing tape bonded to one surface of the cover tape at the terminal parts of the plurality of coaxial cables, a convex portion or a concave portion is provided to the cover tape and to a bonding part of the reinforcing tape.

According to these aspects of the present invention, in a case in which the resin tape is a cover tape, a reinforcing tape, or a combination of a cover tape and a reinforcing tape, the fixed part is provided to these, thereby fixing the coaxial flat cable to the substrate or the connector.

In the coaxial flat cable according to the present invention, the plurality of coaxial cables each include at least a center conductor, an insulator provided on an outer periphery of the center conductor, an external conductor provided on an outer periphery of the insulator, and an outer coated body provided on an outer periphery of the external conductor. Areas connected by soldering to the substrate or the connector are the center conductor and the external conductor. In this case, the insulator is any one of a solid structure, a hollow structure, or a foam structure, and is preferably a hollow structure.

According to this invention, stress concentration on a specific center conductor or external conductor connected by soldering to the substrate or the connector is eliminated, making it possible to prevent damage at the soldered connection parts.

Effect of the Invention

According to the present invention, it is possible to provide a coaxial flat cable used in or between electronic devices such as a liquid crystal television or a server, and configured so that stress is not applied to a specific coaxial cable, even due to handling of the coaxial flat cable or the like. In particular, it is possible to receive applied stress across the entire resin tape and prevent stress from being applied to a specific coaxial cable, and thus stress concentration on the soldered connection parts of a specific external conductor or center conductor is eliminated, making it possible to prevent damage at the soldered connection parts.

EMBODIMENTS OF THE INVENTION

Figure 1:
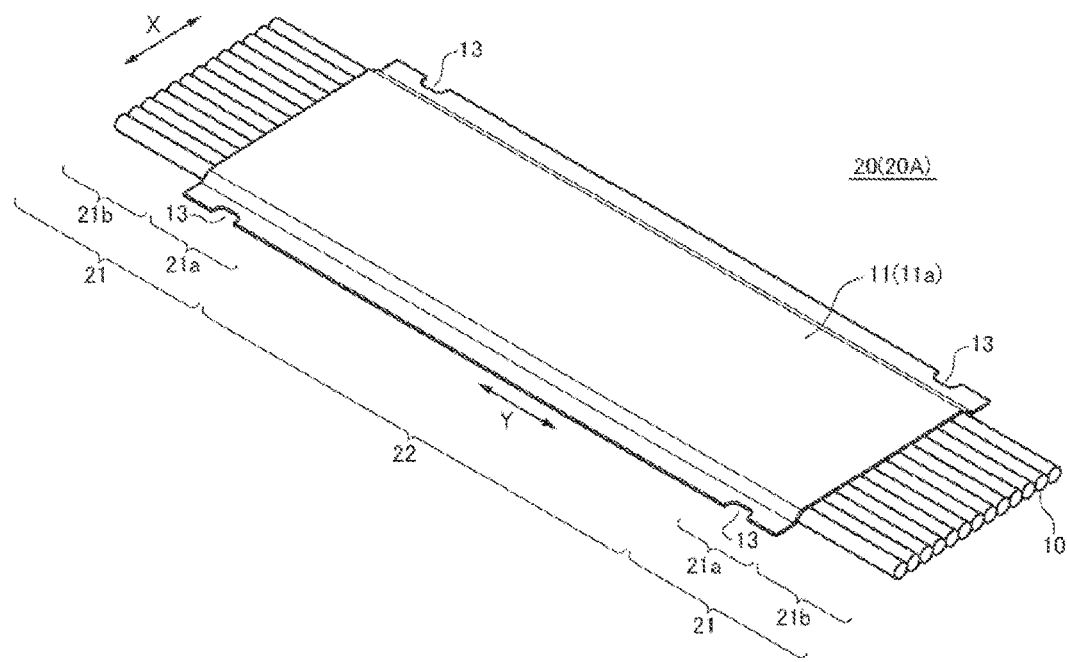
FIG. 1 is a perspective view illustrating an example of a coaxial flat cable according to the present invention.

Embodiments of a coaxial flat cable according to the present invention will now be described with reference to the drawings. It should be noted that the present invention includes aspects of the same technical concept as the forms set forth in the embodiments and the drawings described below, and the technical scope of the present invention is not limited only to the description of the embodiments and the description of the drawings.

A coaxial flat cable 20 according to the present invention, as illustrated in FIG. 1 to FIG. 6, is the coaxial flat cable 20 including a plurality of coaxial cables 10 disposed side by side in a width direction X, and a resin tape 11 bonded to at least terminal parts 21 of the plurality of coaxial cables 10 from one surface or both surfaces to integrate the terminal parts 21, each of the plurality of coaxial cables 10 being connected by soldering to a substrate 30 or a connector (not illustrated). Of the resin tape 11, the resin tape 11 positioned at the terminal parts 21 is provided with a fixed part 21a to be fixed (engaged, fitted, crimped, caulked, or the like) to the substrate 30 or the connector, at both end portions in the width direction X.

In this coaxial flat cable 20, of the resin tape 11 bonded to at least the terminal parts 21 from one surface or both surfaces, the resin tape 11 positioned at the terminal parts 21 is provided with the fixed part 21a, fixed (engaged, fitted, crimped, caulked, or the like) to the substrate 30 or the connector, at both end portions in the width direction X, making it possible to receive the applied stress across the entire resin tape and thus prevent stress from being applied to a specific coaxial cable 10. As a result, stress concentration on soldered connection parts 42, 41 of a specific external conductor 3 or center conductor 1 is eliminated, making it possible to prevent damage at the soldered connection parts 42, 41. It should be noted that the term "at least" means that the resin tape 11 is always provided at the terminal parts 21, but the resin tape 11 may be provided in a middle part 22 other than the terminal parts as well.

In the following, each component of the coaxial flat cable will be described.

<Coaxial Cable>

Figure 8A:
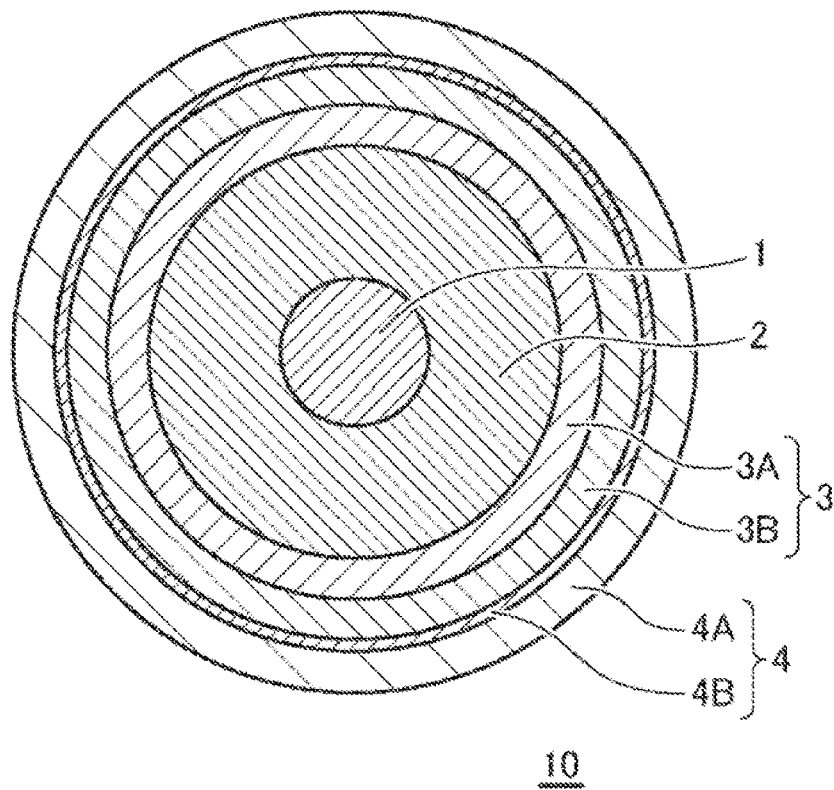
FIGS. 8A and 8B are cross-sectional views of coaxial cables constituting a coaxial flat cable, FIG. 8A being an example of a solid insulator and FIG. 8B being an example of a hollow insulator.
Figure 8B:
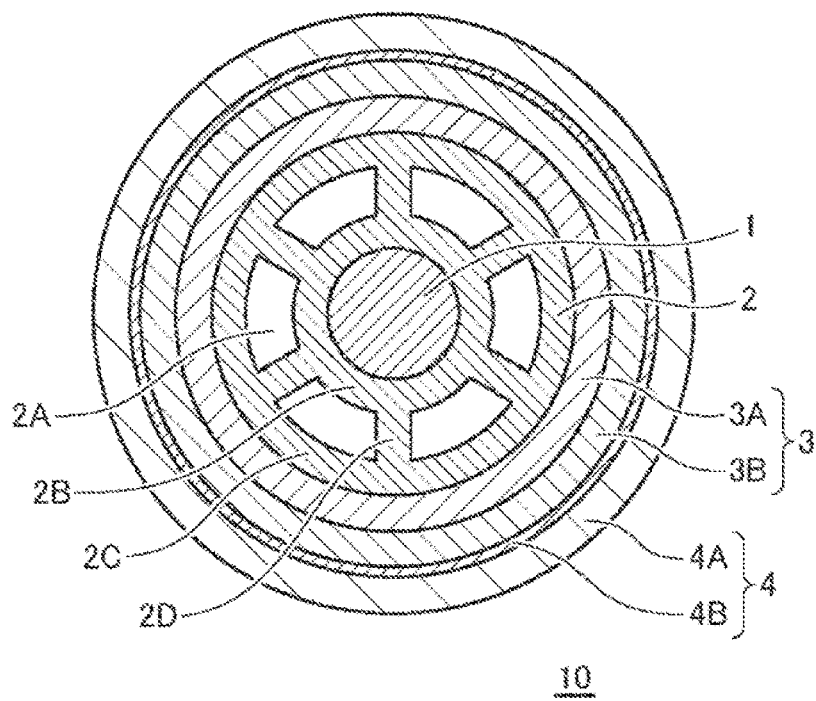

The coaxial cable 10 constitutes the coaxial flat cable 20 and a plurality thereof are disposed side by side in the width direction X, as illustrated in FIG. 1 to FIG. 6. The coaxial cable 10, as illustrated in FIGS. 8A and 8B, includes at least the center conductor 1, an insulator 2 provided on an outer periphery of the center conductor 1, the external conductor 3 provided on an outer periphery of the insulator 2, and an outer coated body 4 provided on an outer periphery of the external conductor 3. Then, as illustrated in FIG. 10 to FIG. 13, in this coaxial cable 10, areas connected by soldering to electrodes 31, 32 of the substrate 30 or the connector are the center conductor 1 and the external conductor 3.

(Center Conductor)

The center conductor 1, as illustrated in FIGS. 8A and 8B, is constituted by a single strand extending in a longitudinal direction Y of the coaxial cable 10, or is constituted by a plurality of strands twisted together. The type of strand is not particularly limited as long as composed of a metal having favorable conductivity, but preferable examples include a metal conductor having favorable conductivity, such as copper wire, copper alloy wire, aluminum wire, aluminum alloy wire, copper-aluminum composite wire, or any of these with a plating layer on a surface thereof. Copper wire and copper alloy wire are particularly preferred from the standpoint of high frequency use. As the plating layer, a solder plating layer, a tin plating layer, a gold plating layer, a silver plating layer, a nickel plating layer, or the like is preferred. A cross-sectional shape of the strand is also not particularly limited, and may be a circular or substantially circular or may be rectangular.

A cross-sectional shape of the center conductor 1 is also not particularly limited. The shape may be circular (including oval) or may be rectangular or the like, but is preferably circular. An outer diameter of the center conductor 1 is desirably as large as possible so that an electric resistance (alternating-current resistance, conductor resistance) is reduced and, to reduce a final outer diameter of the coaxial cable 10, examples thereof include a range of about 0.09 to 1 mm. A surface of the center conductor 1 may be provided with an insulating film (not illustrated), as necessary. A type and a thickness of the insulating film are not particularly limited, but a film that breaks down well during soldering, for example, is preferred, and preferable examples thereof include a thermosetting polyurethane film or the like.

(Insulator)

The insulator 2, as illustrated in FIGS. 8A and 8B, is an insulating layer having a low dielectric constant and continuously provided in the longitudinal direction on the outer periphery of the center conductor 1. A material of the insulator 2 is not particularly limited, and is selected as desired in correspondence with the required impedance characteristics, and a fluorine-based resin having a low dielectric constant of 2.0 to 2.5, such as, for example, perfluoroalkoxy alkane (PFA; ε2.1), ethylene tetrafluoro ethylene (ETFE; ε2.5), or fluorinated ethylene propylene (FEP; ε2.1) is preferred and, among these, PFA resin is preferred. It should be noted that the material of the insulator 2 may contain a coloring agent. A thickness of the insulator 2 is also not particularly limited, and is selected as desired in correspondence with the required impedance characteristics, and a range of about 0.15 to 1.5 mm, for example, is preferred. A method of forming the insulator 2 is not particularly limited, but a solid structure, a hollow structure, or a foam structure can be easily formed by extrusion.

The insulator 2 may be a solid structure illustrated in FIG. 8A, may be a hollow structure illustrated in FIG. 8B, or may be a foam structure (not illustrated). It should be noted that the hollow structure includes a void part 2A in the structure interior, and the void part 2A may have, for example, a cross-sectional form surrounded by an inner annular part 2B, an outer annular part 2C, and a coupling part 2D, or the like. In the case of a hollow structure or a foam structure, there is an additional effect of reducing a material density of the insulator 2, making it possible to soften the insulator 2. The void part 2A is continuously provided in the insulator 2, but the form thereof is not particularly limited, and may be round or rectangular. The insulator 2 with such a hollow structure has excellent side-pressure strength, and thus is not susceptible to being crushed during the manufacture of the coaxial cable 10 and the coaxial flat cable 20, during the wiring work of the coaxial flat cable 20, and the like, making it possible to stabilize high-frequency characteristics. It should be noted that the insulator 2 having a hollow structure can be molded by resin extrusion on the outer periphery of the center conductor 1 running through an extrusion die. A thickness of each of the inner annular part 2B, the outer annular part 2C, and the coupling part 2D is not particularly limited, but is, for example, within a range of about 0.01 to 0.05 mm, and an outer diameter of the insulator 2 having the hollow structure thus formed may be, for example, within a range of about 0.4 to 1.0 mm.

(External Conductor)

The external conductor 3 is provided on the outer periphery of the insulator 2 and may be a fine wire that is braided or laterally wound, may be an insulating tape with a metal layer (for example, polyethylene terephthalate film with a copper layer or the like), or may be a combination of both of these. In the example in FIGS. 8A and 8B, a fine wire lateral winding 3A is provided on the outer periphery of the insulator 2, and an insulating tape 3B with a metal layer is further provided so as to cover the fine wire lateral winding 3A, but the configuration is not limited thereto. A thickness of the external conductor 3 is not particularly limited, and, for example, is within a range of about 0.01 to 0.15 mm.

(Outer Coated Body)

The outer coated body 4 is provided on the outer periphery of the external conductor 3, and a material thereof is not particularly limited as long as the material has insulating properties. Preferably, as exemplified in FIGS. 8A and 8B, the outer coated body can be configured by spirally winding an insulating tape 4A provided with an adhesive layer 4B on one surface, but is not limited to this form. As the adhesive layer 4B, various materials applied to the coaxial cable 10 can be used, and preferable examples include a polyester-based thermoplastic adhesive resin or the like. Further, as the insulating tape 4A, preferable examples include a polyester film such as a polyethylene terephthalate film or polyethylene naphthalate film. In particular, a material having a favorable adhesive property to the resin tape 11 described below is preferably selected and, in a case in which the adhesive layer constituting the resin tape 11 is a polyester-based thermoplastic adhesive layer, for example, preferably the outer coated body 4 is also a polyester film.

(Other)

The coaxial flat cable 20 may be provided with a shielding layer (not illustrated), as necessary. The shielding layer is provided, for example, above the resin tape 11 in FIG. 1 and the like. As the shielding layer, a tape consisting of at least a metal foil and a conductive adhesive layer provided on one surface of the metal foil can be exemplified, but the layer configuration is not particularly limited as long as a shielding function can be exhibited. Further, the shielding layer can also act to maintain uniform electrostatic capacity and external inductance between the center conductor and the shielding layer, and can function to not generate impedance mismatch in this portion.

<Resin Tape>

The resin tape 11 constitutes the coaxial flat cable 20 and, as illustrated in FIG. 1 to FIG. 7, is bonded to at least the terminal parts 21 of the plurality of coaxial cables 10 disposed side by side in the width direction X from one surface or both surfaces to integrate the terminal parts 21. As the resin tape 11, a cover tape 11a, a reinforcing tape 11b, and a bonding part 11c of the cover tape 11a and the reinforcing tape 11b can be exemplified, but the tape is not limited thereto. The term "at least" means that the resin tape 11 (11a, 11b, 11c) is always provided at the terminal parts 21, but the resin tape 11 (11a) may be provided in the middle part 22 other than the terminal parts as well. It should be noted that "both surfaces" refers to upper and lower surfaces of the plurality of coaxial cables 10 disposed side by side in the width direction X, as illustrated in FIGS. 7A and 7C, and "one surface" refers to one surface (lower surface, for example) of the plurality of coaxial cables 10 disposed side by side in the width direction X, as illustrated in FIG. 7B.

Figure 6:
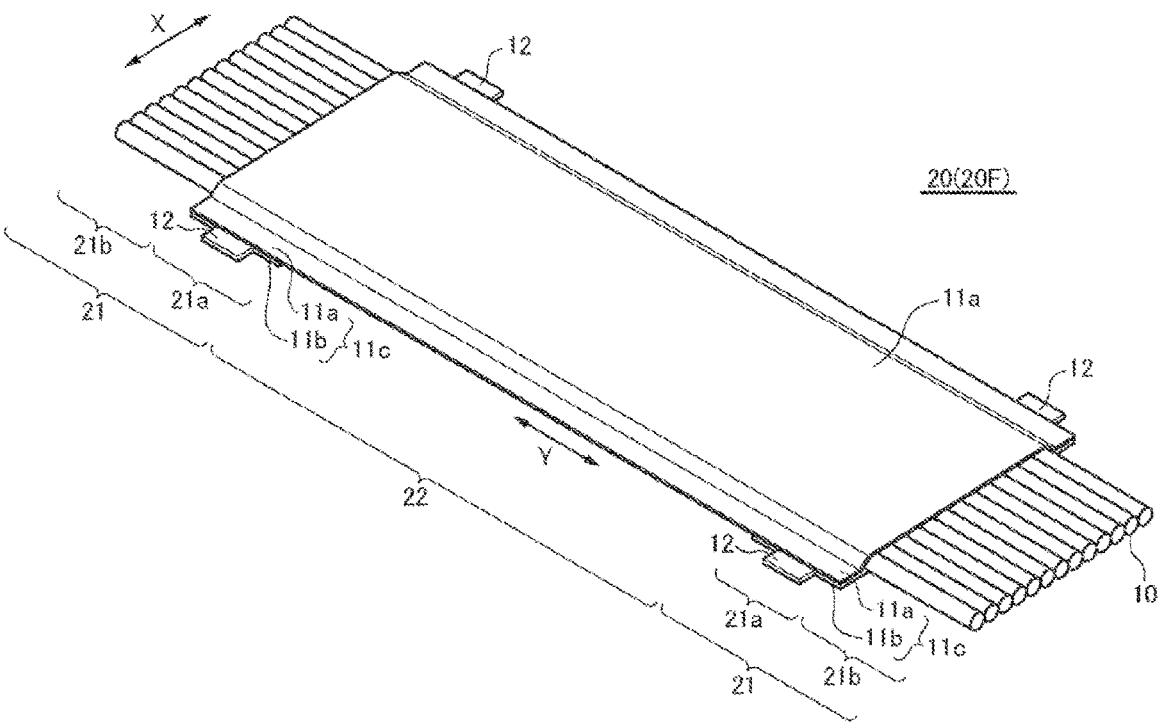
FIG. 6 is a perspective view illustrating another example of the coaxial flat cable according to the present invention.
Figure 7A:
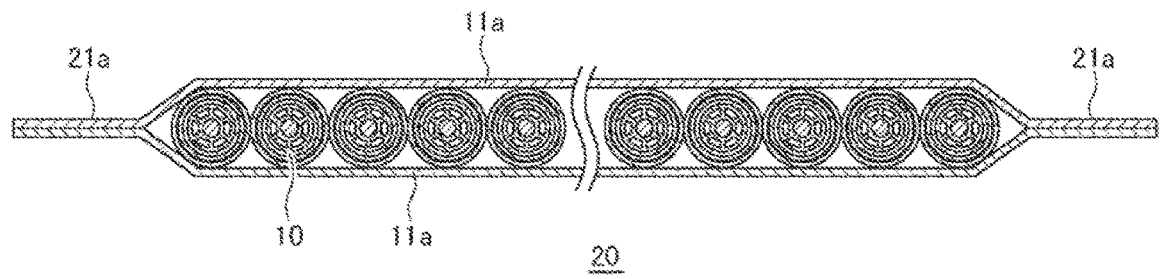
FIGS. 7A to 7C are cross-sectional views of coaxial flat cables, FIG. 7A being the coaxial flat cable in FIG. 1, FIG. 7B being the coaxial flat cable in FIG. 2, and FIG. 7C being the coaxial flat cable in FIG. 3.
Figure 7B:
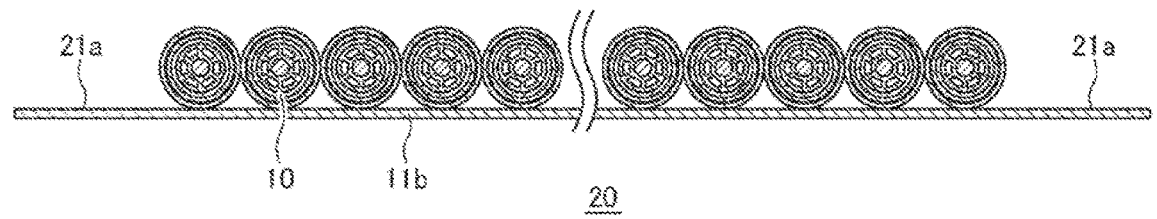
Figure 7C:
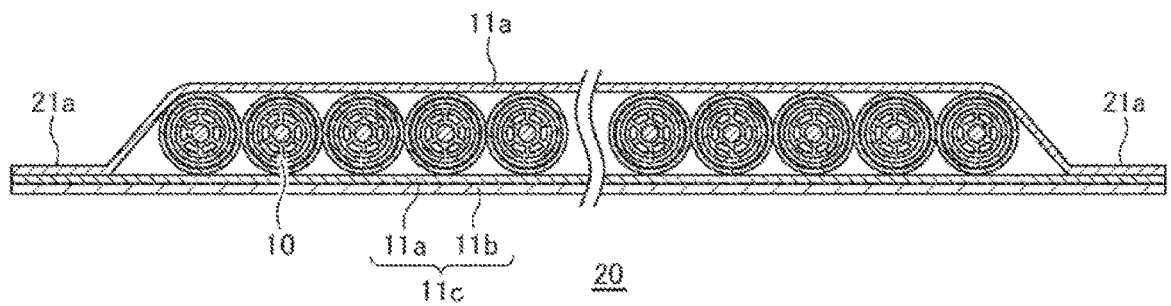

(a) The resin tape 11 illustrated in FIG. 1, FIG. 3, FIG. 4, and FIG. 6 is provided as the cover tape 11a over the entire surface of the plurality of coaxial cables 10, including the terminal parts 21 and the middle part 22 and, as illustrated in FIGS. 7A and 7C, two cover tapes 11a, 11a are provided so as to sandwich and cover the entirety from both surfaces. In such a mode, the configuration of a surface of the cover tape 11a covering the coaxial cables 10 may be flat or may be formed with unevenness, and preferably the configuration of the surface (degree of flatness, degree of unevenness, degree of hardness, and the like, for example) is uniform from the terminal parts 21 across the longitudinal direction Y and the width direction X of the middle part 22, and does not include any special processed portions. In this way, it is possible to obtain the easy-to-handle, low-cost coaxial flat cable 20 that does not undergo special processing.

Figure 2:
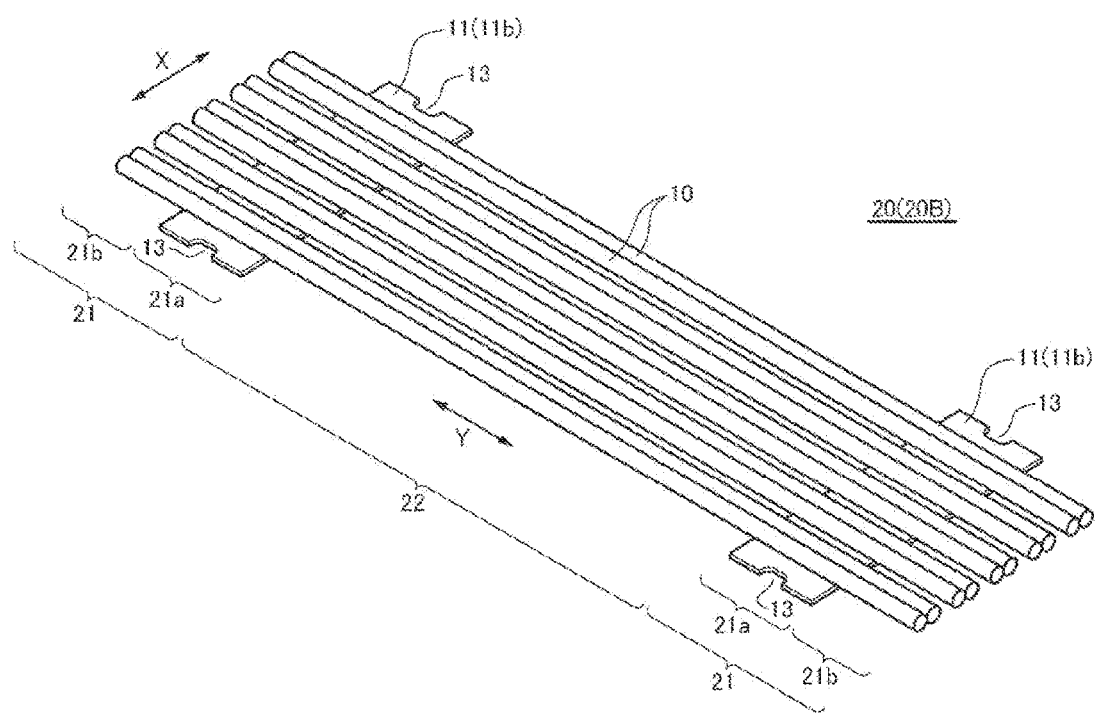
FIG. 2 is a perspective view illustrating another example of the coaxial flat cable according to the present invention.
Figure 5:
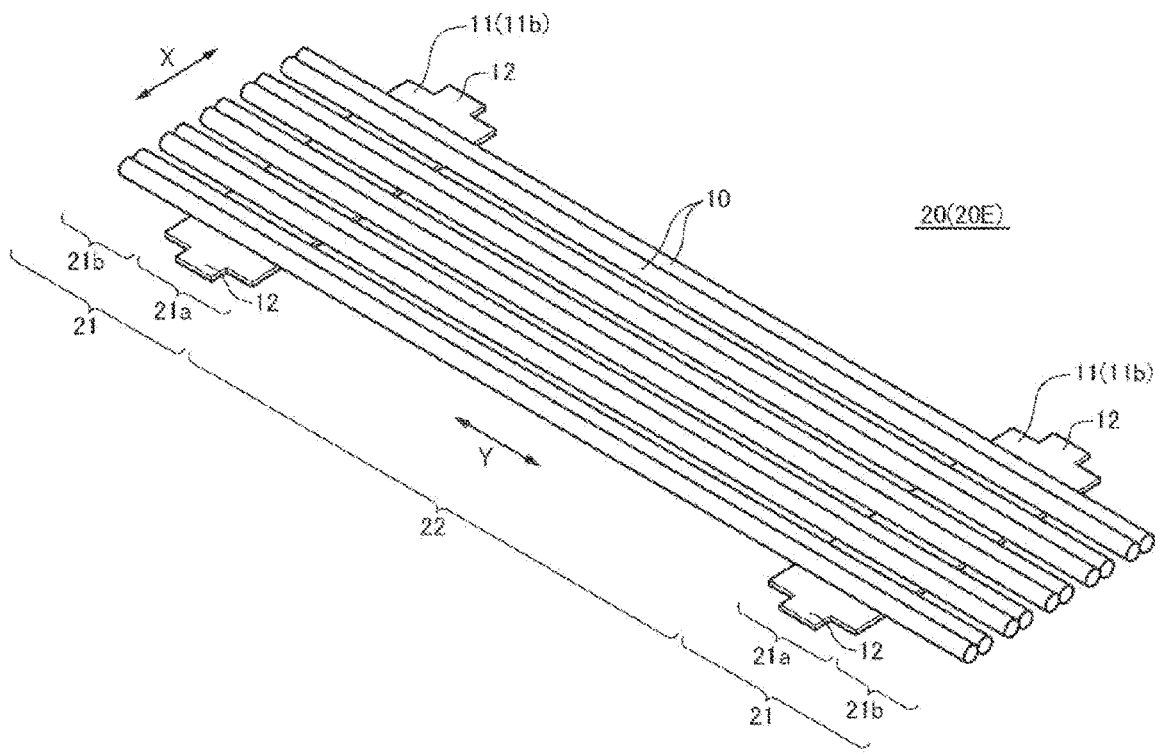
FIG. 5 is a perspective view illustrating another example of the coaxial flat cable according to the present invention.

(b) The resin tape 11 illustrated in FIG. 2, FIG. 5, and FIG. 7B is the reinforcing tape 11b provided at the terminal parts 21 of the plurality of coaxial cables 10. In this example, the fixed parts 21a are provided with at both end portions in the width direction X of the reinforcing tape 11b. As illustrated in FIG. 2 and the like, the reinforcing tape 11b is provided only at the terminal parts 21 of the plurality of coaxial cables 10 in the longitudinal direction Y, and the middle part 22 is a non-integrated portion. The non-integrated portion allows the middle part 22 to readily deform, making it possible to improve the degree of freedom during wiring in the electronic device. It should be noted that a length of the reinforcing tape 11b in the longitudinal direction Y need only be at least a length to which a projection 12, a notch 13, a hole 14, or the like can be provided, and is preferably, for example, about 5 to 20 mm.

Figure 3:
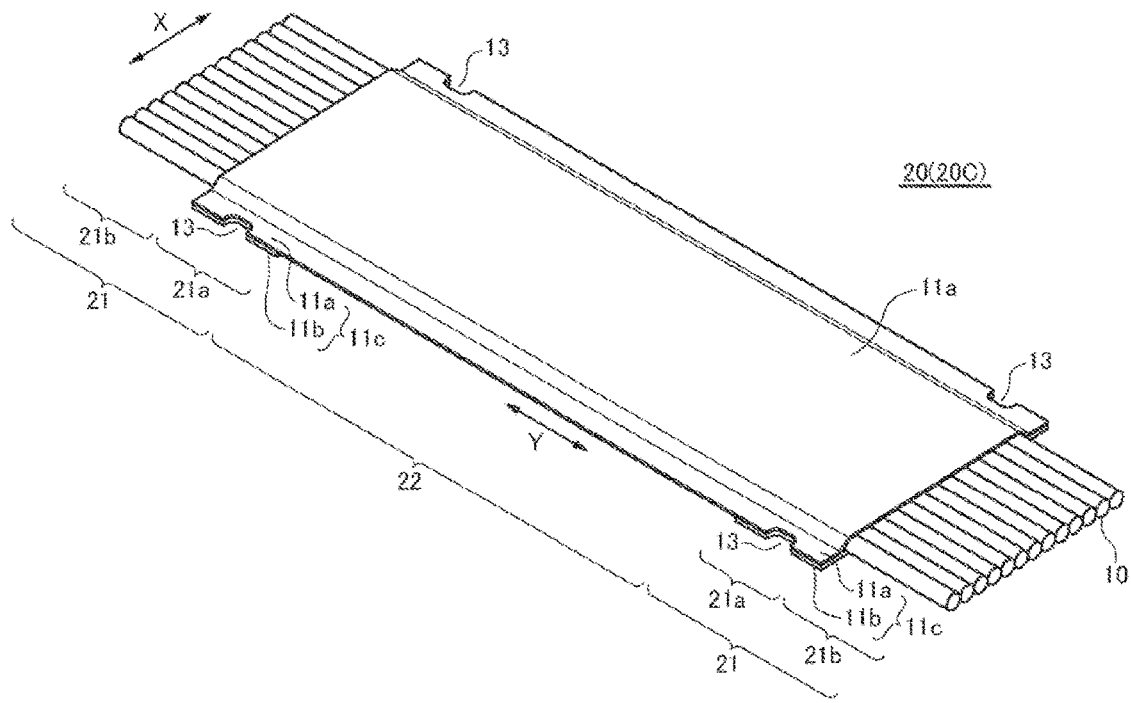
FIG. 3 is a perspective view illustrating another example of the coaxial flat cable according to the present invention.

(c) The resin tape 11 illustrated in FIG. 3, FIG. 6, and FIG. 7C is constituted by the cover tape 11a that sandwiches and integrates the plurality of coaxial cables fully from both surfaces, and the reinforcing tape 11b bonded to one surface of the cover tape 11a at the terminal parts 21 of the plurality of coaxial cables 10. In this example, in the bonding part 11c where the cover tape 11a described above and the reinforcing tape 11b described above are bonded together, the fixed part 21a is provided at both end portions in the width direction X. In this example, the cover tape 11a and the reinforcing tape 11b have the same configurations as those described in (a) and (b).

In (a) to (c), the cover tape 11a and reinforcing tape 11b described above are usually constituted by a base material and an adhesive layer. For the cover tape 11a, the base material is not particularly limited, but a polyester film such as polyethylene terephthalate and polyethylene naphthalate can be preferably used. A thickness of the base material is selected as desired within a range of about 0.025 to 0.1 mm. The adhesive layer is also not particularly limited, but is desirably a material that can be bonded to the outer coated body 4 to be bonded with favorable adhesive property, and preferable examples include a polyester-based thermoplastic adhesive resin layer or the like. A thickness of the adhesive layer is selected as desired within a range of about 0.02 to 0.035 mm.

For the reinforcing tape 11b as well, the base material is not particularly limited, but a polyester film such as polyethylene terephthalate and polyethylene naphthalate, or a polycarbonate film can be preferably used. These base materials also have excellent dimensional stability and have the advantage of being resistant to dimensional changes caused by fitting forces applied during connection to connectors as well as temperature changes and the passage of time. A thickness of the base material is selected as desired within a range of about 0.025 to 0.3 mm. The adhesive layer is also not particularly limited, but is desirably a material that can be bonded to the outer coated body 4 to be bonded with favorable adhesive property, and preferable examples include a polyester-based thermoplastic adhesive resin layer or the like. A thickness of the adhesive layer is selected as desired within a range of about 0.02 to 0.05 mm.

The bonding part 11c composed of the cover tape 11a and the reinforcing tape 11b is a combination of the cover tape 11a and the reinforcing tape 11b described above, as illustrated in FIG. 3, FIG. 6 and FIG. 7C, and thus a description thereof will be omitted here.

<Fixed Part>

As illustrated in FIG. 1 to FIG. 7, the coaxial flat cable 20 is constituted by the terminal parts 21 positioned on both sides in the longitudinal direction Y and the middle part 22 other than the terminal parts 21. The terminal parts 21 are each constituted by the fixed part 21a and a terminal processed part 21b. The fixed part 21a is provided at both end portions in the width direction X of the resin tape 11 positioned at the terminal parts 21, and is fixed to the substrate 30 or the connector, as illustrated in FIG. 10 to FIG. 13. The fixing is performed by engaging, fitting, crimping, caulking, or the like the fixed part 21a and a fitting part 33.

Figure 9:
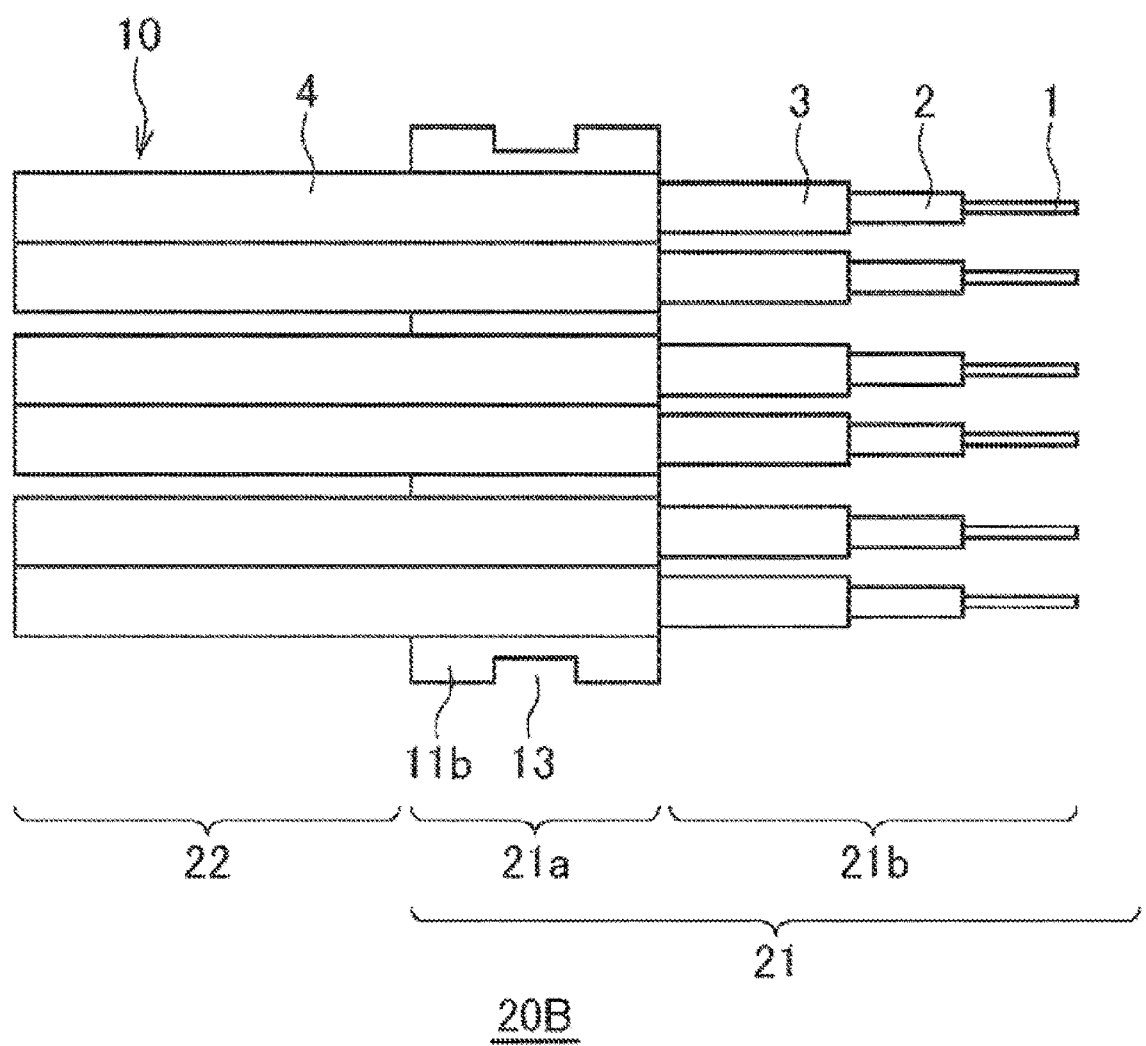
FIG. 9 is a plan view illustrating a form of a coaxial flat cable after terminal processing.

The terminal processed part 21b is illustrated as a case of not yet processed in the examples in FIG. 1 to FIG. 6, but is terminal-processed into a form such as illustrated in FIG. 9. The terminal processed part 21b is processed so that the center conductor 1, the insulator 2, and the external conductor 3 are each exposed and, as illustrated in FIG. 10 to FIG. 13, the center conductor 1 is soldered to the electrode 31 of the substrate 30 to obtain the soldered connection part 41, and the external conductor 3 is soldered to the electrode 32 of the substrate 30 to obtain the soldered connection part 42. In the present invention, the coaxial flat cable 20 is not fixed at the soldered connection parts 41, 42 as in the prior art, but is fixed between the fixed part 21a and the fitting part 33. As a result, it is possible to receive stresses applied to the soldered connection parts 41, 42 in the prior art across the entire resin tape, and thus prevent stress from being applied to the soldered connection parts 41, 42 of a specific coaxial cable 10. As a result, stress concentration on the soldered connection parts 41, 42 of a specific center conductor 1 or external conductor 3 is eliminated, making it possible to prevent damage at the soldered connection parts 41, 42.

Figure 10A:
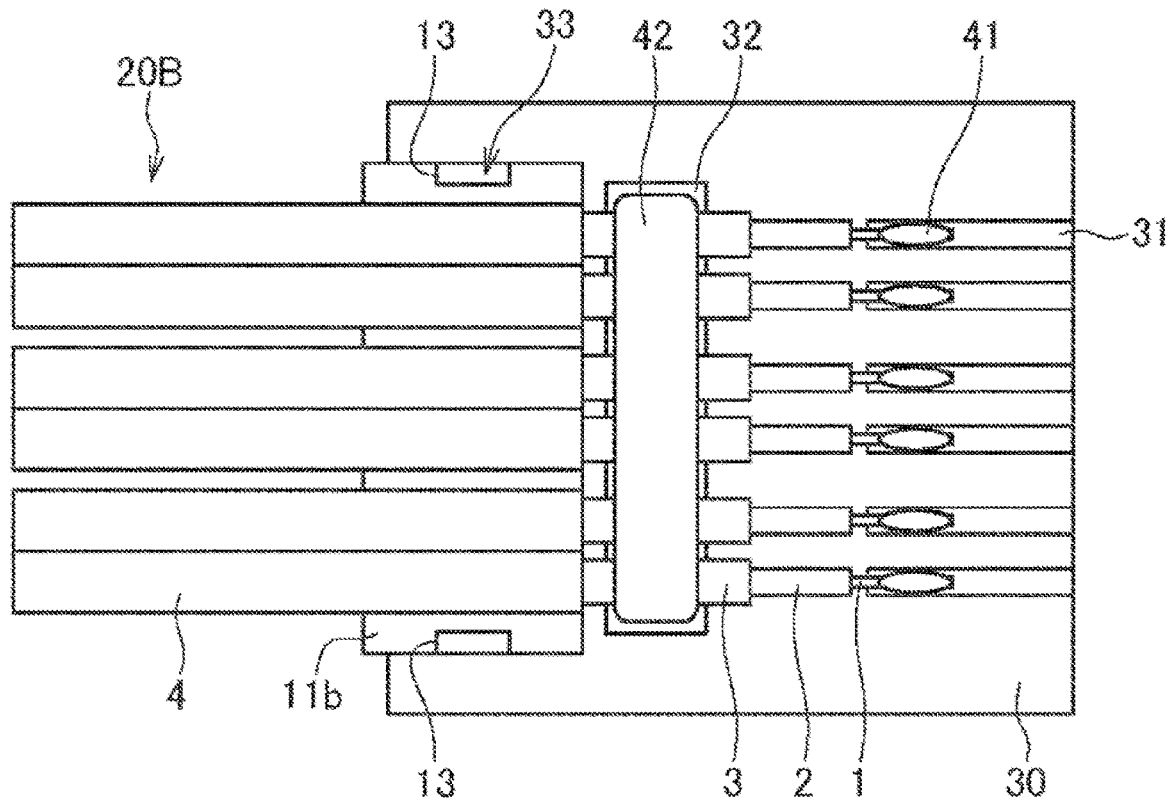
FIGS. 10A and 10B are a plan view and a side view, respectively, illustrating a form of a coaxial flat cable provided with a notch as a fixed part, after being soldered to a substrate.
Figure 10B:
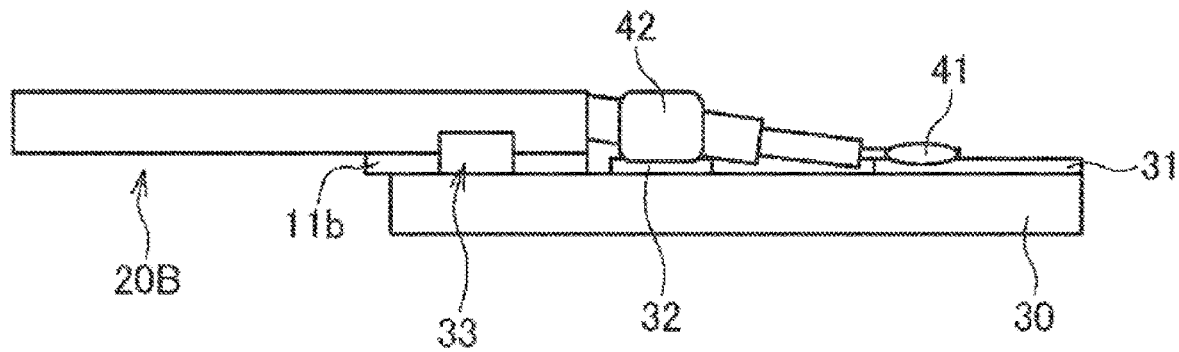

A form of the fixed part 21a is not particularly limited as long as engaged, fitted, crimped, caulked, or the like to the fitting part 33 of the substrate or the like, and preferably is the notch 13 such as illustrated in FIG. 1 to FIG. 3, FIG. 9, and FIGS. 10A and 10B, for example. This notch 13 may be a semi-circular notch such as illustrated in FIG. 1 to FIG. 3, or may be a rectangular notch such as illustrated in FIG. 9 and FIGS. 10A and 10B.

Figure 4:
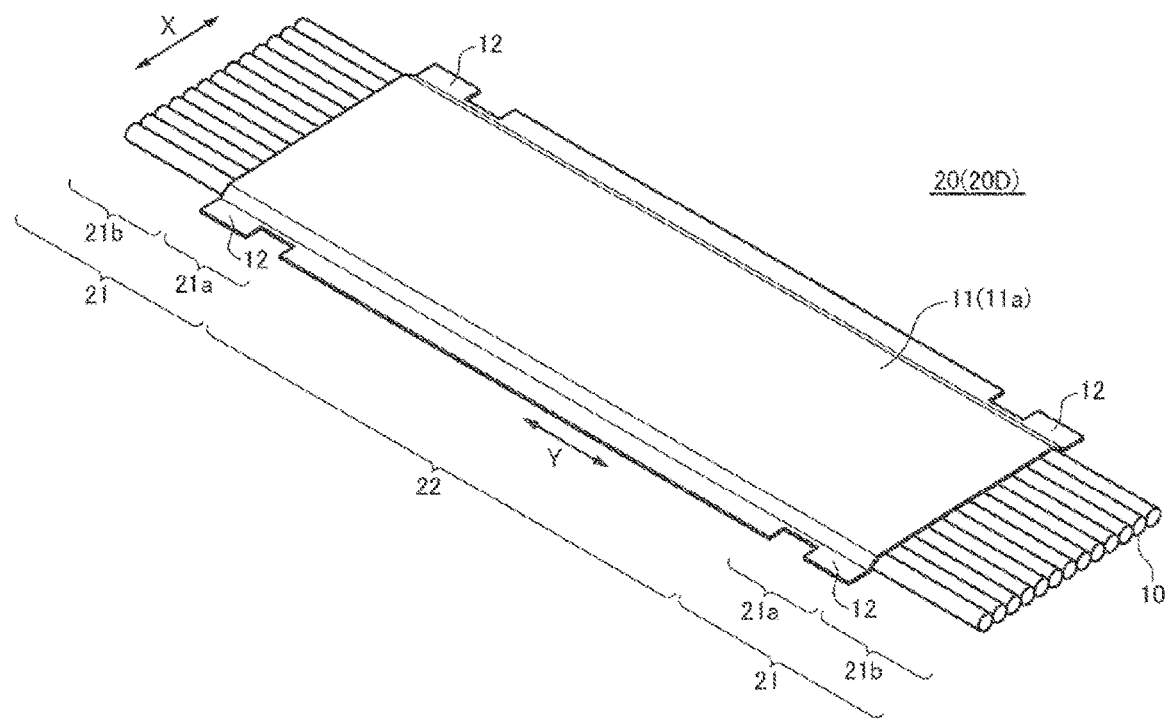
FIG. 4 is a perspective view illustrating another example of the coaxial flat cable according to the present invention.

Further, the fixed part 21a is preferably the projection 12 such as illustrated in FIG. 4 to FIG. 6, FIGS. 12A and 12B, and FIGS. 13A and 13B, for example. This projection 12 may be a projection obtained by projecting, in the width direction X, an end portion side in the longitudinal direction Y of the cover tape 11a such as illustrated in FIG. 4, or may be a projection projecting to both ends in the width direction X of the reinforcing tape 11b such as illustrated in FIG. 5, FIG. 6, and FIGS. 12A and 12B.

Figure 11A:
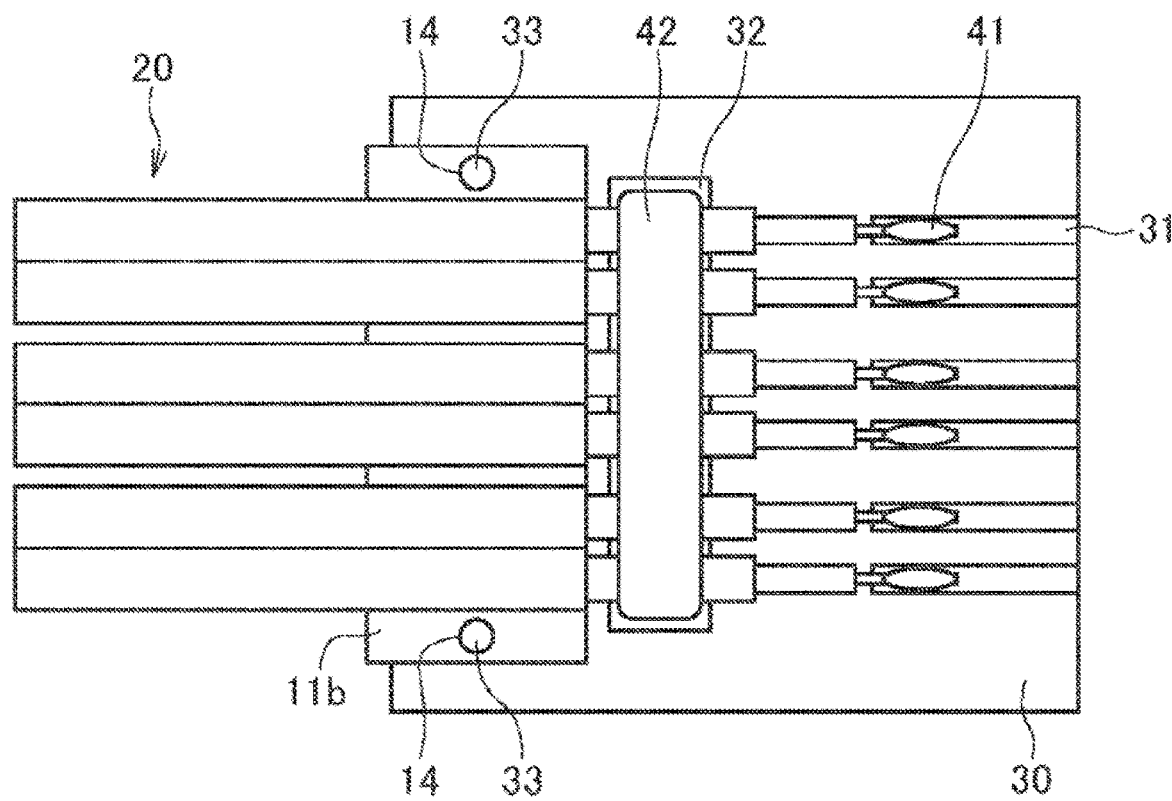
FIGS. 11A and 11B are a plan view and a side view, respectively, illustrating a form of a coaxial flat cable provided with a hole as a fixed part, after being soldered to a substrate.
Figure 11B:
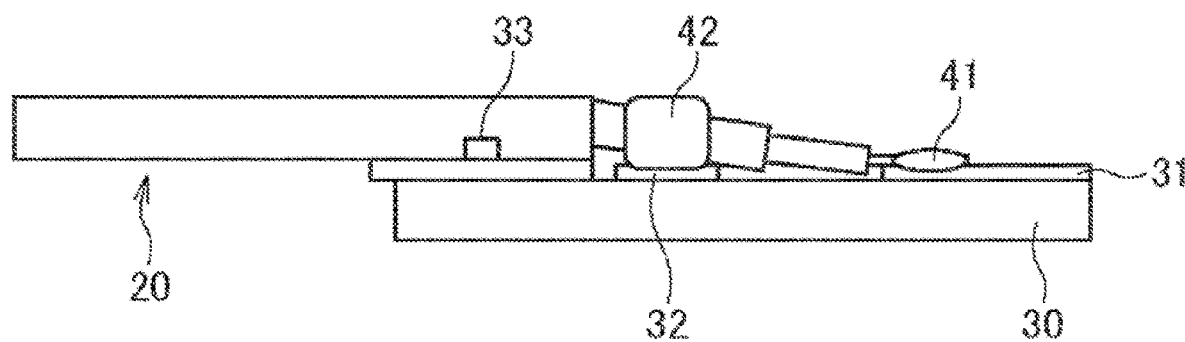
Figure 12A:
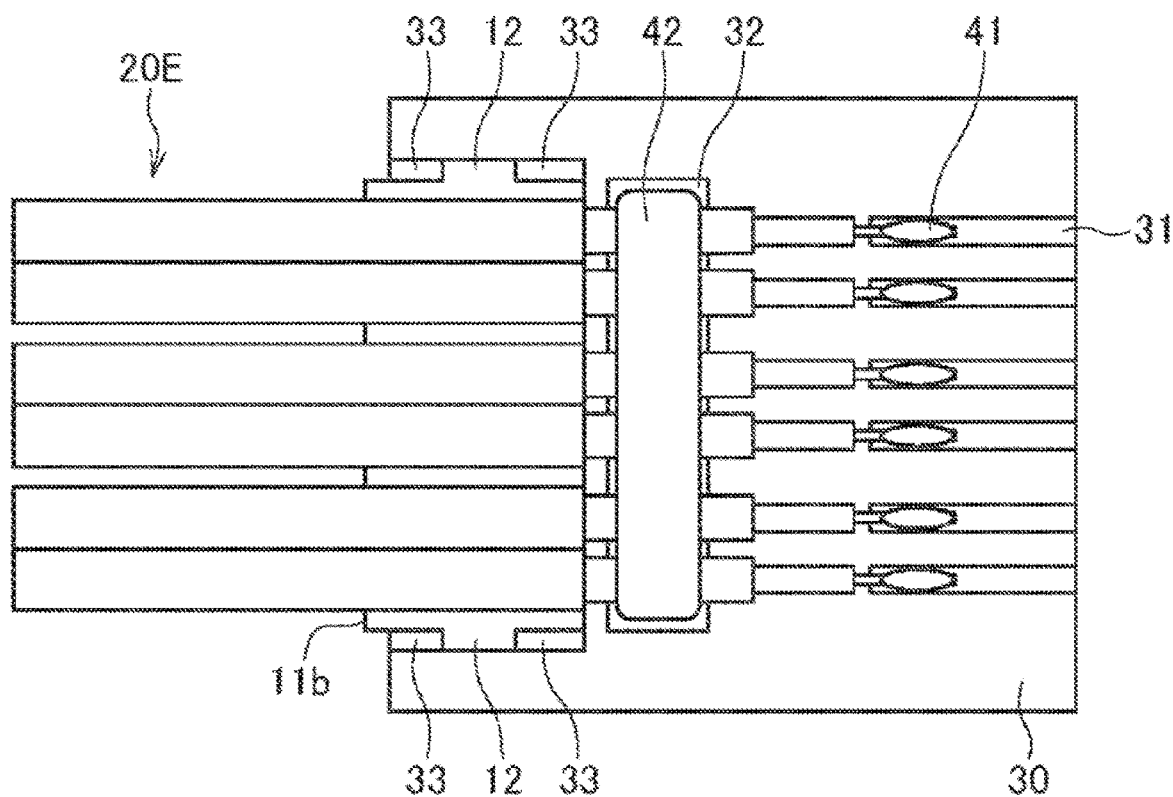
FIGS. 12A and 12B are a plan view and a side view, respectively, illustrating a form of a coaxial flat cable provided with a projection as a fixed part, after being soldered to a substrate.
Figure 12B:
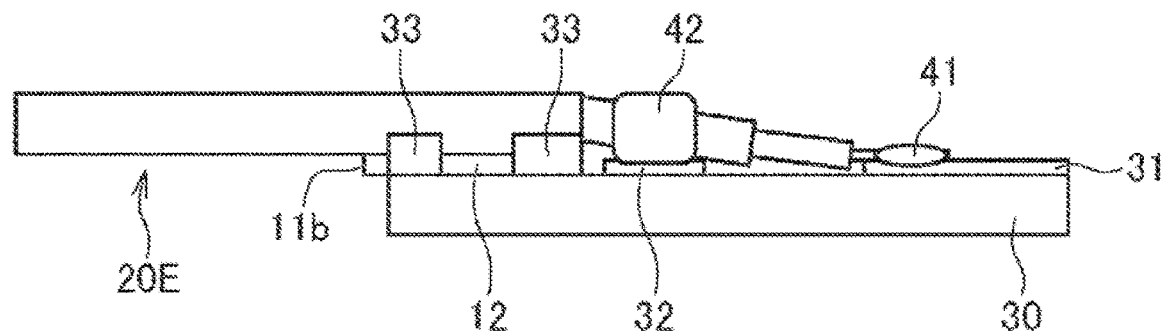

Further, the fixed part 21a is preferably the hole 14 such as illustrated in FIGS. 11A and 11B, for example. This hole 14 is provided in the reinforcing tape 11b in the example in FIGS. 11A and 11B, but may be provided in the cover tape 11a (not illustrated) as in the notch 13.

Further, although not illustrated, the fixed part 21a may be crimped or caulked.

(Coaxial Flat Cable)

The coaxial flat cable 20 thus obtained can be used in or between electronic devices such as a liquid crystal television or a server, and configured so that stress is not applied to a specific coaxial cable 10, even due to handling of the coaxial flat cable 20 or the like. As a result, stress concentration on the soldered connection parts of a specific external conductor or center conductor is eliminated, making it possible to prevent damage at the soldered connection parts.

In the coaxial flat cable 20, the plurality of coaxial cables 10 disposed side by side in the width direction X may be arranged at a fixed pitch or may be arranged so that the coaxial cables 10 adjacent to each other are in contact. Further, as illustrated in FIG. 2, FIG. 9 to FIG. 13, and the like, pairs of two in contact with each other may be arranged side by side at regular intervals.

Further, this coaxial flat cable 20 also allows an outer diameter of the center conductor 1 to be increased without increasing an outer diameter of the coaxial cable 10. As a result, an effective cross-sectional area of the center conductor 1 can be increased to suppress an increase in high-frequency resistance (alternating-current resistance). Furthermore, the center conductor 1 is not susceptible to being crushed during manufacture (for example, during pressurization such as heat sealing, or the like), wiring work, or the like, and thus a distance between the center conductor 1 and the external conductor 3 does not change, making it possible to stabilize the characteristic impedance and high-frequency characteristics.

EXAMPLES

The present invention will now be more specifically described below through examples. It should be noted that the present invention is not limited to the examples below.

[Fabrication of Coaxial Cable]

For the coaxial cable 10, AWG32 (outer diameter: approximately 0.24 mm) obtained by twisting 7 silver-plated soft copper wires having a diameter of 0.08 mm was used as the center conductor 1. The insulator 2 was obtained by extruding PFA resin (manufactured by DuPont) at 350° C. in a die and a nipple for a hollow structure, and forming a hollow structure having a cross-sectional form in which the void part 2A is surrounded by the inner annular part 2B, the outer annular part 2C, and the coupling part 2D, as illustrated in FIG. 8B. In this hollow structure, a thickness of the inner annular part 2B was 0.05 mm, a thickness of the outer annular part 2C was 0.05 mm, a thickness of the coupling part 2D was 0.05 mm, an outer diameter of the hollow structure (insulator 2) was 0.60 mm, and a porosity of the void part 2A was 30% of the area of the entire insulator (entire hollow structure). The dielectric constant 8 was approximately 1.6.

For the external conductor 3, 38 tin-plated soft copper wires having a diameter of 0.05 mm were used to obtain the fine wire lateral winding 3A having a lateral winding by wrapping the wires on the outer periphery of the insulator 2 at a 12-mm pitch by using a lateral winding shielding machine. Furthermore, a polyethylene terephthalate film having a thickness of 0.004 mm, formed with a copper layer having a thickness of 0.008 mm thereon (insulating tape 3B with metal layer), was cut to a width of 2.5 mm and wrapped by 1/3.5 wrap with the copper layer being on the fine wire lateral winding 3A side by using a tape winding machine. Next, a polyester tape (insulating tape 4A) having a thickness of 0.004 mm and provided with a polyester thermoplastic resin (adhesive layer 4B) having a thickness of 0.001 mm on one surface was cut to a width of 3.0 mm and wrapped by 1/3 wrap with the adhesive layer 4B being on the external conductor side by using a tape winding machine.

[Coaxial Flat Cable]

Example 1

Sixteen coaxial cables 10 thus obtained were prepared, pairs of two in contact with each other were arranged side by side at regular intervals as illustrated in FIG. 2 and FIG. 9, and subsequently the entire surface was bonded from both surfaces by the cover tape 11a to integrate the coaxial cables 10 as illustrated in FIG. 1, thereby obtaining the coaxial flat cable 20 illustrated in FIG. 7A. The cover tape 11a was bonded using a polyethylene terephthalate film base material having a thickness of 0.025 mm and provided with a polyester thermoplastic resin (adhesive layer) having a thickness of 0.035 mm on one surface, cut to a width of 25 mm. A coaxial flat cable 20B was cut to a predetermined length, and the notch 13 was provided in a semicircular shape with a radius of 1.5 mm, at both end portions in the width direction X at a position of 5 mm from the end surface in the longitudinal direction Y of the cover tape 11a (refer to FIG. 1). A coaxial flat cable 20A thus fabricated was attached to the substrate. For attachment, the notches 13 were fitted into the fitting parts, and the center conductor 1 was soldered to the soldered connection part 41 and the external conductor 3 was soldered to the soldered connection part 42.

Example 2

Sixteen coaxial cables 10 thus obtained were prepared, pairs of two in contact with each other were arranged side by side at regular intervals as illustrated in FIG. 2 and FIG. 9, and subsequently the reinforcing tape 11b was bonded to one surface to integrate the coaxial cables 10 as illustrated in FIG. 2, thereby obtaining the coaxial flat cable 20 illustrated in FIG. 7B. The reinforcing tape 11b was bonded using a polyethylene terephthalate film base material having a thickness of 0.125 mm and provided with a polyester thermoplastic resin (adhesive layer) having a thickness of 0.042 mm on one surface, cut to 25 mm in the width direction X and to 10 mm in the longitudinal direction Y. The coaxial flat cable 20 was cut to a predetermined length, and the notch 13 was provided in a semicircular shape with a radius of 1.5 mm, at both end portions in the width direction X at a position of 5 mm from the end surface of the reinforcing tape 11b (refer to FIG. 2). The coaxial flat cable 20B thus fabricated was attached to the substrate 30, as illustrated in FIGS. 10A and 10B. For attachment, as illustrated in FIGS. 10A and 10B, the notches 13 were fitted into the fitting parts 33, and the center conductor 1 was soldered to the soldered connection part 41 and the external conductor 3 was soldered to the soldered connection part 42.

Example 3

Sixteen coaxial cables 10 thus obtained were prepared, pairs of two in contact with each other were arranged side by side at regular intervals as illustrated in FIG. 2 and FIG. 9, and subsequently the entire surface was bonded from both surfaces by the cover tape 11a to integrate the coaxial cables 10 as illustrated in FIG. 3, and the reinforcing tape 11b was further bonded to the terminal parts 21 of one surface of the cover tape 11a, thereby obtaining the coaxial flat cable 20 illustrated in FIG. 7C. The cover tape 11a and reinforcing tape 11b were bonded using the same tape as those used in Example 1 and Example 2, respectively. The coaxial flat cable 20 was cut to a predetermined length, and the projection 12 was provided at a projecting length of 1.5 mm, at both end portions in the width direction X at a position of 5 mm from the end surface of the bonding part 11c (refer to FIG. 6).

Example 4

Figure 13A:
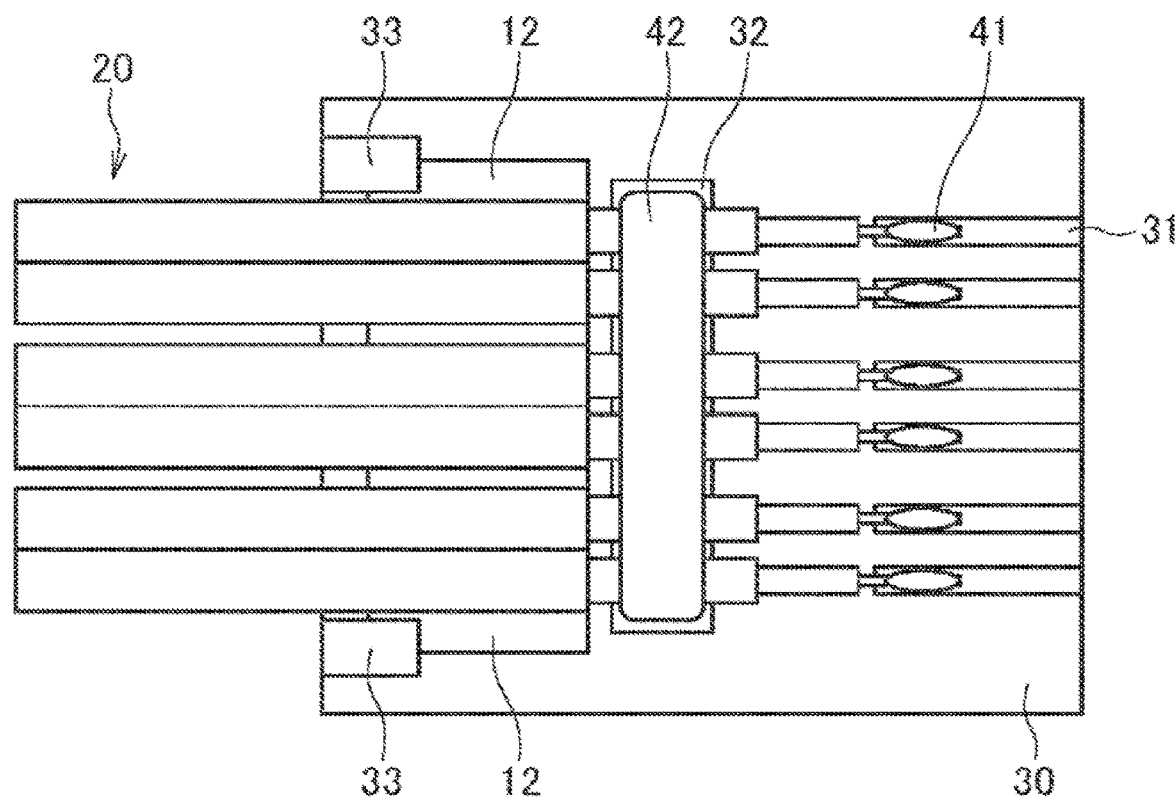
FIGS. 13A and 13B are a plan view and a side view, respectively, illustrating a form of a coaxial flat cable provided with a projection as a fixed part, after being soldered to a substrate.
Figure 13B:
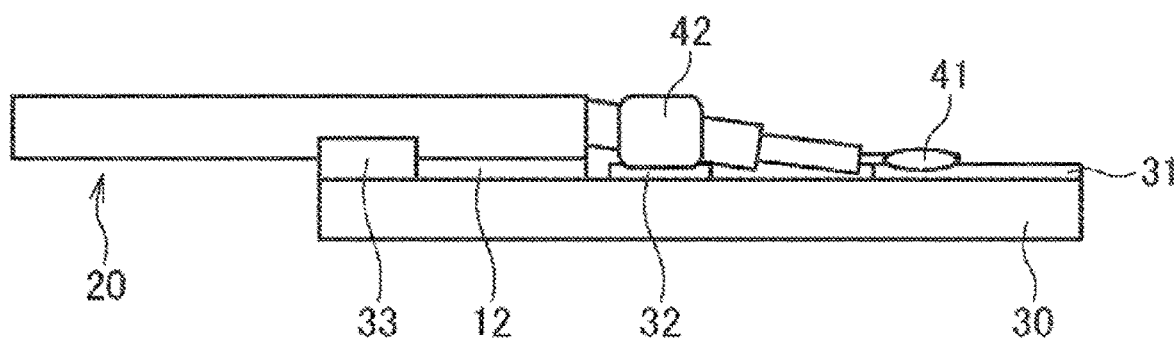

Sixteen coaxial cables 10 thus obtained were prepared, pairs of two in contact with each other were arranged side by side at regular intervals as illustrated in FIG. 2 and FIG. 9, and subsequently the reinforcing tape 11b was bonded to one surface to integrate the coaxial cables 10 as illustrated in FIG. 2, thereby obtaining the coaxial flat cable 20 illustrated in FIG. 7B. The reinforcing tape 11b was bonded using a polyethylene terephthalate film base material having a thickness of 0.125 mm and provided with a polyester thermoplastic resin (adhesive layer) having a thickness of 0.042 mm on one surface, cut to 25 mm in the width direction X and to 10 mm in the longitudinal direction Y. The coaxial flat cable 20 was cut to a predetermined length, and the projection 12 having a length of 7 mm was provided by notching both end portions from 7 mm to 10 mm from the end surface of the reinforcing tape 11b (refer to FIGS. 13A and 13B). The coaxial flat cable 20 thus fabricated was attached to the substrate 30, as illustrated in FIGS. 13A and 13B. For attachment, as illustrated in FIGS. 13A and 13B, the projections 12 were fitted into the fitting parts 33, and the center conductor 1 was soldered to the soldered connection part 41 and the external conductor 3 was soldered to the soldered connection part 42.

DESCRIPTIONS OF REFERENCE NUMERALS

1 Center conductor
2 Insulator
2A Void part
2B Inner annular part
2C Outer annular part
2D Coupling part
2E Void part
3 External conductor
3A Fine wire lateral winding
3B Insulating tape with metal layer
4 Outer coated body
4A Insulating tape
4B Adhesive layer
10 Coaxial cable
11 Resin tape
11a Cover tape
11b Reinforcing tape
11c Bonding part
12 Projection
13 Notch
14 Hole
20, 20A to 20F Coaxial flat cable
21 Terminal part
21a Fixed part
21b Terminal processed part
22 Middle part (Portion other than terminal part)
30 Substrate
31 Electrode
32 Electrode
33 Fitting part
41 Soldered connection part of center conductor
42 Soldered connection part of external conductor
X Width direction
Y Longitudinal direction

What is claimed is:

1. A coaxial flat cable comprising:
a plurality of coaxial cables disposed side by side in a width direction; and
a resin tape bonded to at least terminal parts of the plurality of coaxial cables from one surface or both surfaces to integrate the terminal parts,
each of the plurality of coaxial cables being connected by soldering to a substrate or a connector, and
of the resin tape, the resin tape positioned at the terminal parts being provided with a fixed part, to be fixed to the substrate or the connector, at both end portions in the width direction,
wherein the resin tape is a reinforcing tape provided to the terminal parts of the plurality of the coaxial cables, and the fixed part is provided to the reinforcing tape.

2. The coaxial flat cable according to claim 1, wherein the fixed part comprises a hole or a projection fitted to a fitting part provided on the substrate or the connector.

3. The coaxial flat cable according to claim 1, wherein the fixed part comprises a notch fitted to a fitting part provided on the substrate or the connector.

4. The coaxial flat cable according to claim 1, wherein the plurality of coaxial cables each include at least a center conductor, an insulator provided on an outer periphery of the center conductor, an external conductor provided on an outer periphery of the insulator, and an outer coated body provided on an outer periphery of the external conductor, and
areas connected by soldering to the substrate or the connector are the center conductor and the external conductor.

5. A coaxial flat cable comprising:
a plurality of coaxial cables disposed side by side in a width direction; and
a resin tape bonded to at least terminal parts of the plurality of coaxial cables from one surface or both surfaces to integrate the terminal parts,
each of the plurality of coaxial cables being connected by soldering to a substrate or a connector, and
of the resin tape, the resin tape positioned at the terminal parts being provided with a fixed part, to be fixed to the substrate or the connector, at both end portions in the width direction,
wherein the resin tape is a cover tape that sandwiches and integrates the plurality of coaxial cables fully from both surfaces, and a reinforcing tape is bonded to one surface of the cover tape at the terminal parts of the plurality of coaxial cables, and
wherein the fixed part is provided to the cover tape and to a bonding part of the reinforcing tape.

6. The coaxial flat cable according to claim 5, wherein the fixed part comprises a hole or a projection fitted to a fitting part provided on the substrate or the connector.

7. The coaxial flat cable according to claim 5, wherein the fixed part comprises a notch fitted to a fitting part provided on the substrate or the connector.

8. The coaxial flat cable according to claim 5, wherein the plurality of coaxial cables each include at least a center conductor, an insulator provided on an outer periphery of the center conductor, an external conductor provided on an outer periphery of the insulator, and an outer coated body provided on an outer periphery of the external conductor, and areas connected by soldering to the substrate or the connector are the center conductor and the external conductor.

\* \* \* \* \*